(12) United States Patent
Higashijima et al.

(10) Patent No.: US 8,607,807 B2
(45) Date of Patent: Dec. 17, 2013

(54) LIQUID TREATMENT APPARATUS AND METHOD

(75) Inventors: Jiro Higashijima, Koshi (JP); Norihiro Itoh, Koshi (JP)

(73) Assignee: Tokyo Electron Limited, Minato-Ku (JP)

( * ) Notice: Subject to any disclaimer, the term of this patent is extended or adjusted under 35 U.S.C. 154(b) by 0 days.

(21) Appl. No.: 13/355,844

(22) Filed: Jan. 23, 2012

(65) Prior Publication Data

US 2012/0186607 A1 Jul. 26, 2012

(30) Foreign Application Priority Data

Jan. 25, 2011 (JP) ................................. 2011-013459

(51) Int. Cl.
*B08B 3/08* (2006.01)
*B08B 3/02* (2006.01)
*B08B 5/00* (2006.01)

(52) U.S. Cl.
USPC ...... 134/102.1; 134/94.1; 134/95.1; 134/95.3

(58) Field of Classification Search
USPC ............................. 134/94.1, 95.1, 95.3, 102.1
See application file for complete search history.

(56) References Cited

U.S. PATENT DOCUMENTS

| | | | |
|---|---|---|---|
| 6,247,479 B1* | 6/2001 | Taniyama et al. | 134/95.2 |
| 2003/0194878 A1* | 10/2003 | Miya | 438/745 |
| 2003/0196683 A1* | 10/2003 | Izumi et al. | 134/2 |
| 2004/0040177 A1* | 3/2004 | Izumi | 34/492 |
| 2004/0084144 A1* | 5/2004 | Yokouchi et al. | 156/345.11 |
| 2005/0115671 A1* | 6/2005 | Araki | 156/345.12 |
| 2007/0207706 A1* | 9/2007 | Takahashi | 451/28 |
| 2008/0083501 A1* | 4/2008 | Arai et al. | 156/345.21 |
| 2009/0014033 A1* | 1/2009 | Tokuno et al. | 134/18 |
| 2009/0090391 A1* | 4/2009 | Edamoto | 134/18 |

FOREIGN PATENT DOCUMENTS

JP 2007-287999 A1 11/2007

* cited by examiner

*Primary Examiner* — Michael Barr
*Assistant Examiner* — Benjamin L Osterhout
(74) *Attorney, Agent, or Firm* — Burr & Brown, PLLC

(57) ABSTRACT

A liquid treatment method including: retaining a substrate with a treatment target surface being set as a lower surface, and rotating the substrate; supplying DIW (deionized water) to the lower surface of the substrate, thereby performing a rinsing process to the substrate; and thereafter supplying a mist containing IPA (isopropyl alcohol) and $N_2$ gas, thereby substituting the IPA for the DIW. The supplying of the mist is performed using a nozzle positioned below the substrate, the nozzle comprising a plurality of ejection ports which are arrayed between a position opposing a central portion of the substrate and a position opposing a peripheral portion of the substrate.

6 Claims, 12 Drawing Sheets

LIQUID TREATMENT APPARATUS AND METHOD

CROSS-REFERENCE TO RELATED APPLICATION

This application is based on and claims the benefit of priorities from Japanese Patent Application No. 2011-013459 filed on Jan. 25, 2011, the entire contents of which are incorporated herein by reference.

BACKGROUND OF THE INVENTION

1. Field of the Invention

The present disclosure relates to a liquid treatment apparatus and method that perform a liquid treatment such as cleaning and etching to a substrate by supplying a treatment liquid to a lower surface of the substrate.

2. Description of Related Art

In a semiconductor manufacturing process, substrates such as semiconductor wafers are subjected to cleaning or etching with use of a chemical liquid in order to remove unnecessary films adhering to the front or back surface of the wafer (e.g., oxide films, nitride films, or resist films having been used as a mask). In general, a rinsing step and a drying step are subsequently performed after a chemical liquid treatment step using the same apparatus for performing the chemical liquid treatment step.

JP2007-287999A discloses a liquid treatment apparatus capable of executing the aforementioned process steps. The liquid treatment apparatus includes a spin chuck that holds the peripheral portion of a wafer and rotate it, and a front surface nozzle that supplies a treatment liquid to the central portion of the wafer upper surface, a back surface nozzle that supplies a treatment liquid to the central portion of the wafer lower surface. The front and back surface nozzles can supply a chemical cleaning liquid, a rinsing liquid such as deionized water, and a drying solvent such as IPA.

One of the foregoing unnecessary films is a natural oxide film ($SiO_2$ film). When a wafer is cleaned with DHF (diluted hydrofluoric acid), a natural oxide film is removed so that bare Si is exposed. That is, a hydrophilic $SiO_2$ surface is altered to a hydrophobic Si surface. After the DHF cleaning step, a DIW (deionized water) rinsing step and a spin-drying step are performed. When a hydrophobic surface having DIW thereon is dried, uneven drying is likely to occur, in other words, water marks are likely to occur. In order to avoid generation of water marks, an WA substituting step that substitutes IPA (isopropyl alcohol) for DIW is performed between the DIW rinsing step and the spin-drying step. If such an IPA substituting step is performed to the wafer lower surface by a method taught in JP2007-287999A, the IPA can hardly be spread over the wafer lower surface uniformly. This is because IPA has a low surface tension and is thus likely to drop by gravity. In addition, a large amount of IPA is required to cover the whole wafer lower surface.

SUMMARY OF THE INVENTION

The present disclosure provides a technique, for use in a liquid treatment apparatus and method for processing a lower surface of a substrate, that can efficiently dry a treatment target surface of a substrate with the use of IPA.

In one embodiment, there is provided a liquid treatment method including: retaining a substrate with a treatment target surface being set as a lower surface, and rotating the substrate; supplying DIW (deionized water) to the lower surface of the substrate, thereby performing a rinsing process to the substrate; and thereafter supplying a mist containing IPA (isopropyl alcohol) and $N_2$ gas, thereby substituting the IPA for the DIW, wherein the supplying of the mist is performed using a nozzle positioned below the substrate, the nozzle comprising a plurality of ejection ports which are arrayed between a position opposing a central portion of the substrate and a position opposing a peripheral portion of the substrate.

In another embodiment, there is provided a liquid treatment method including: a substrate retaining unit comprising a retaining member configured to hold a peripheral edge of a substrate to retain the substrate horizontally; a rotational driving unit configured to rotate the substrate retaining unit; and a nozzle comprising a first ejection port provided to eject a chemical liquid toward a lower surface of the substrate retained by the substrate retaining unit, a plurality of second ejection ports provided to eject a mist containing IPA (isopropyl alcohol) and $N_2$ gas toward the lower surface of the substrate retained by the substrate retaining unit, a third ejection port provided to eject DIW (deionized water) toward the lower surface of the substrate retained by the substrate retaining unit, and a forth ejection port provided to eject $N_2$ gas toward the lower surface of the substrate retained by the substrate retaining unit, wherein the plurality of second ejection ports are arrayed between a position opposing to a central portion of the substrate and a position opposing to a peripheral portion of the substrate retained by the substrate retaining unit.

According to the foregoing embodiments, since the mist containing IPA and $N_2$ gas is ejected toward the lower surface of the substrate using the nozzle having the plurality of ejection ports are arrayed between a position opposing to a central portion of the substrate and a position opposing to a peripheral portion of the substrate, the whole lower surface can be replaced with IPA uniformly and rapidly.

DETAILED DESCRIPTON OF THE INVENTION

Figure 1:
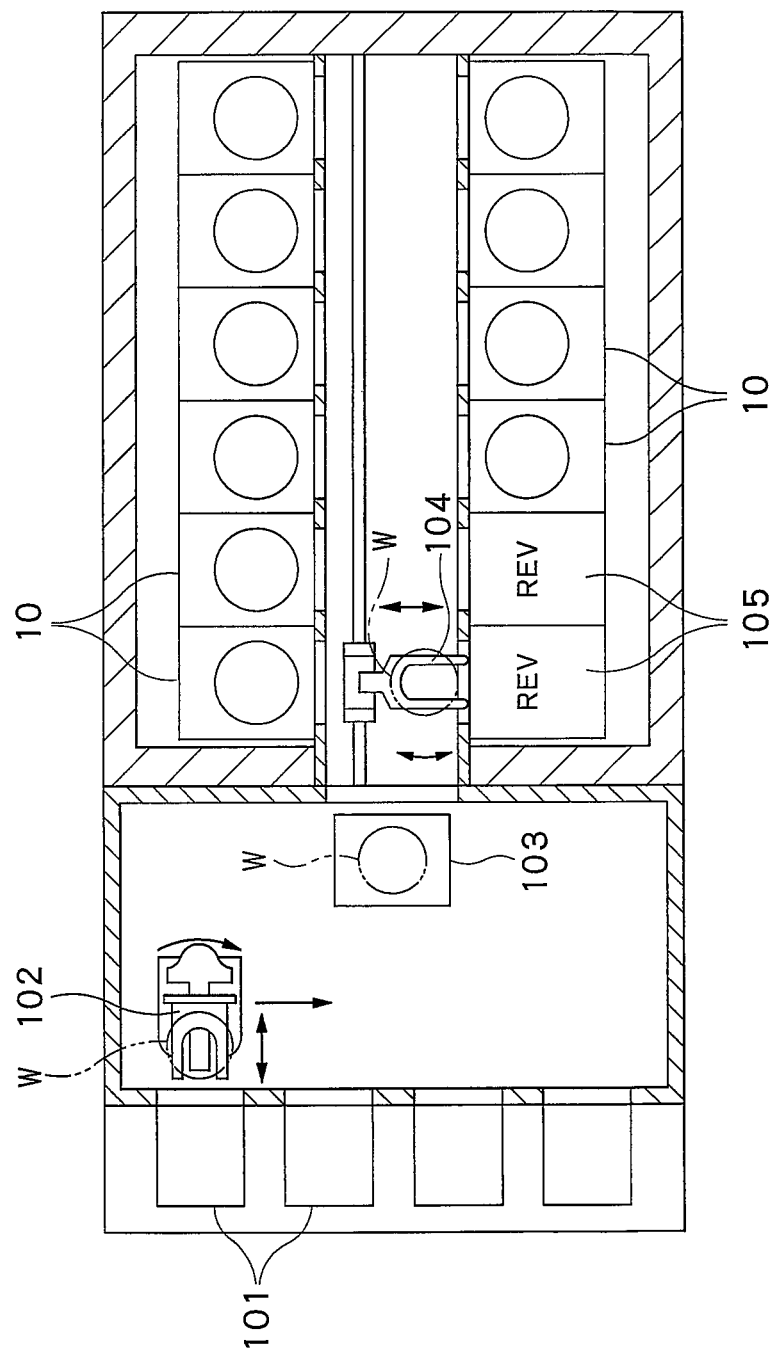
FIG. 1 is a top plan view of a liquid treatment system which includes substrate cleaning apparatuses in one embodiment.

An embodiment of a liquid treatment apparatus will be described with reference to the accompanying drawings. First, a liquid treatment system including a substrate cleaning apparatus in one embodiment of a liquid treatment apparatus will be described below with reference to FIG. 1. As shown in FIG. 1, the liquid treatment system includes: mounting tables 101 each for mounting thereon a carrier accommodating a semiconductor wafer W (i.e., substrate to be processed) (hereinafter, simply referred to as "wafer W") which is transported thereto from the outside of the system; a transport arm 102 for removing the wafer W from the carrier; a shelf unit 103 for placing thereon the wafer W removed from the carrier by the transport arm 102; and a transport arm 104 for receiving the wafer W from the shelf unit 103 and for transporting the wafer W to the substrate cleaning apparatus 10. As shown in FIG. 1, a plurality of (ten, in the embodiment of FIG. 1) liquid treatment apparatuses and two wafer reversers 105 are installed in the liquid treatment system. The transport arm 104 has substantially a U-shape in a top plan view, and is shaped such that transport arm 104 does not touch the lift pins 22 (described later) and a V-shaped nozzle 60 (also described later) when the transport arm 104 places the wafer W onto or remove the wafer W from the lift pins 22 (see FIG. 10B).

Next, a schematic configuration of one substrate cleaning apparatus 10 is described below with reference to FIGS. 2A and 2B. The substrate cleaning apparatus 10 includes: a retaining plate 30 for retaining the wafer W; a lift pin plate 20 provided above the retaining plate 30 and including lift pins 22 to support the wafer W from below; a rotational driving unit 39 equipped with an electric motor or the like to rotate the retaining plate 30; a treatment fluid supply pipe 40 routed through a through-hole 30a formed centrally in the retaining plate 30 and a through-hole 20a formed centrally in the lift pin plate 20; and a V-shaped nozzle 60 for spraying, towards a lower surface of the wafer W, a treatment fluid supplied via the treatment fluid supply pipe 40. The lift pin plate 20 is constructed to rotate in association with the retaining plate 30 during treatment.

The lift pin plate 20, the treatment fluid supply pipe 40, and the V-shaped nozzle 60 can be moved vertically in a relative fashion with respect to the retaining plate 30. FIG. 2A shows a state where the lift pin plate 20, the treatment fluid supply pipe 40, and the V-shaped nozzle 60 are positioned at their respective lower positions. FIG. 2B shows a state where the lift pin plate 20, the treatment fluid supply pipe 40, and the V-shaped nozzle 60 are positioned at their respective upper positions. The lift pin plate 20, the treatment fluid supply pipe 40, and the V-shaped nozzle 60 move up and down between their lower positions shown in FIG. 2A and their upper positions shown in FIG. 2B.

Next, each constituent element of the substrate cleaning apparatus 10 is described in detail.

Figure 2B:
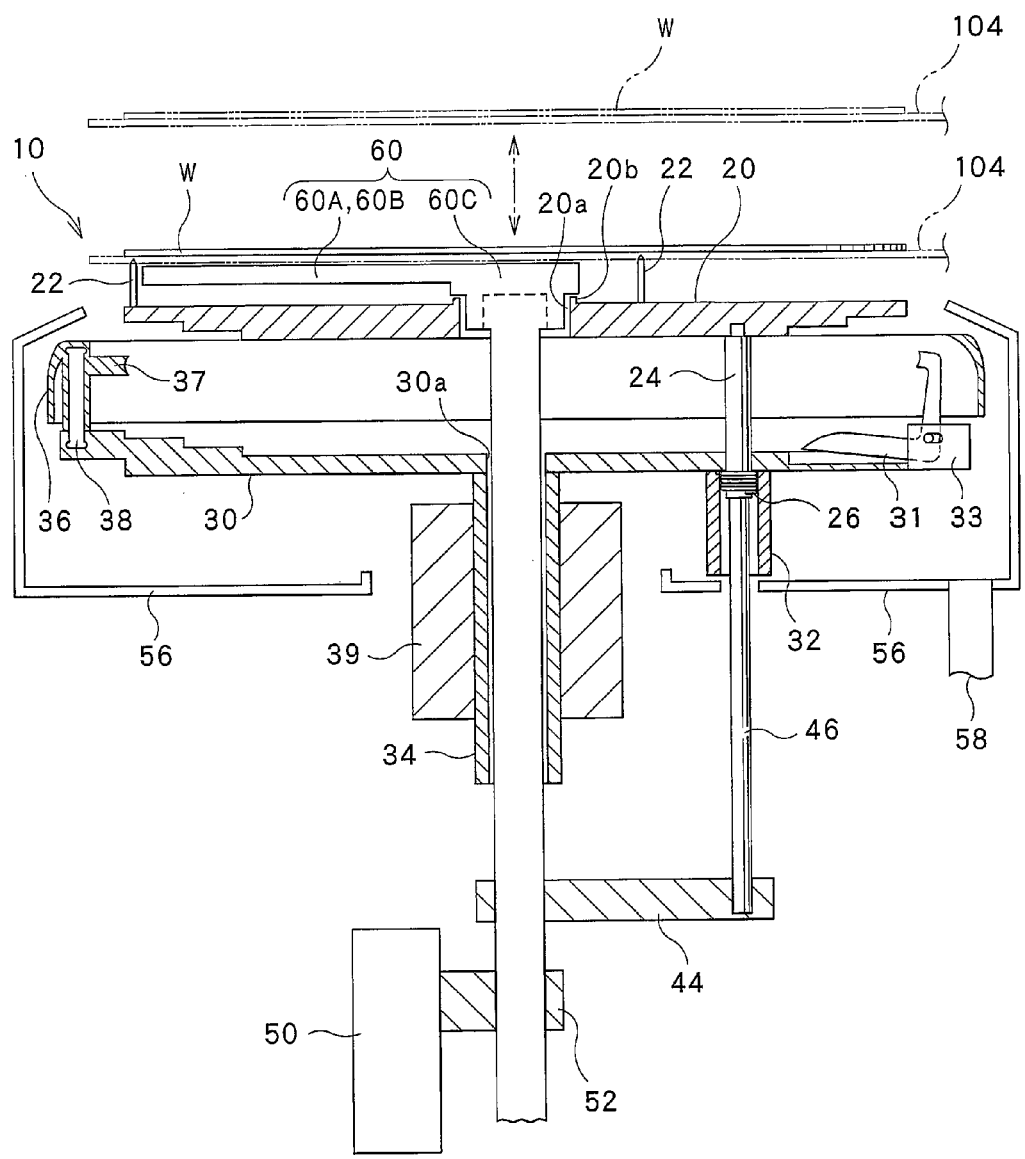
FIG. 2B is a vertical cross sectional view showing the configuration of the substrate cleaning apparatus in a state where the lift pin plate and the cleaning liquid supply pipe are located at their raised positions.
Figure 2C:
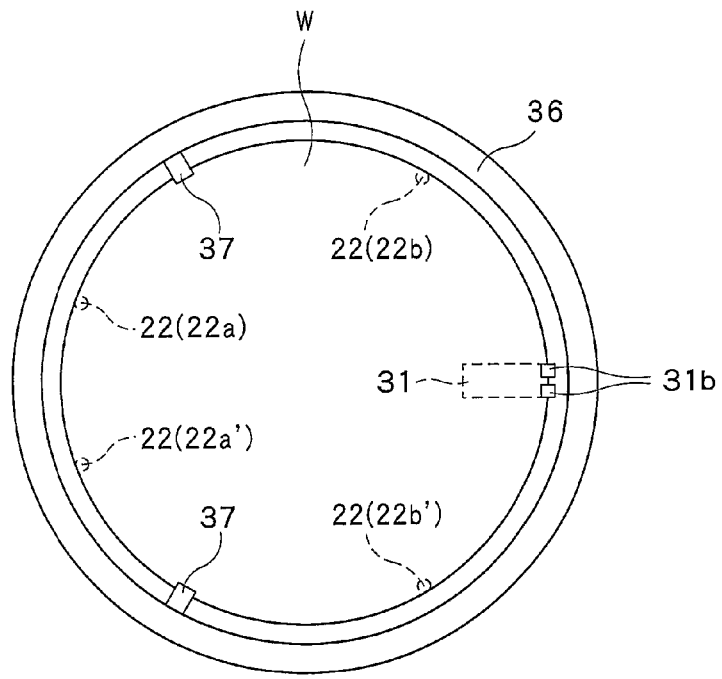
FIG. 2C is a top plan view of the substrate cleaning apparatus in a state where a wafer is retained by a substrate retaining member and fixed retaining members as shown in FIG. 2A.
Figure 3:
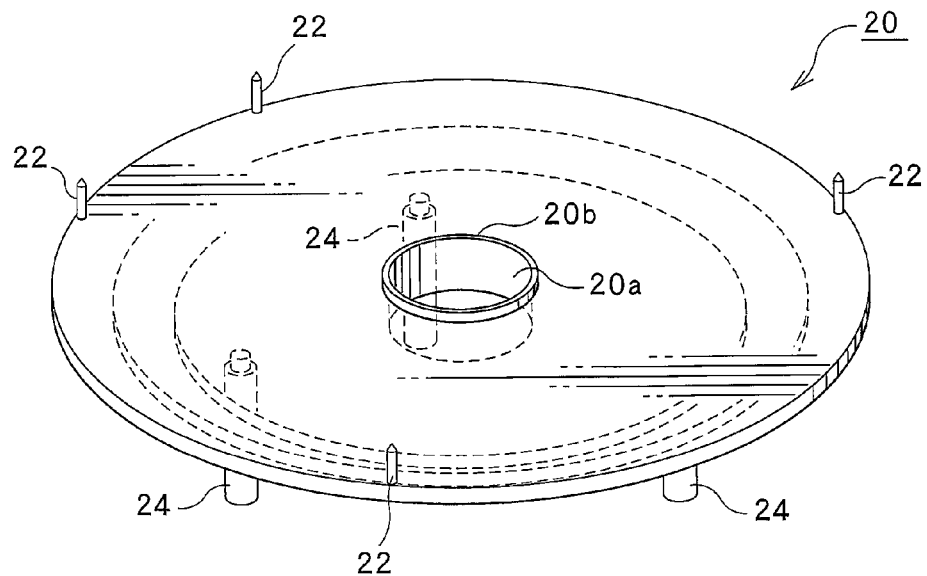
FIG. 3 is a perspective view showing the configuration of the lift pin plate of the substrate cleaning apparatus shown in FIGS. 2A and 2B.

As shown in FIG. 3, the lift pin plate 20 has a disk-like shape with the through-hole 20a formed in its central portion. An annular protrusion 20b is provided around the through-hole 20a to prevent a liquid on the lift pin plate 20 from entering the through-hole 20a. The treatment fluid supply pipe 40 is routed through the through-hole 20a. The lift pin plate 20 comprises thereon a plurality of (in the present example, four) lift pins 22 near its peripheral edge. In this embodiment, as shown in FIG. 2C, four lift pins 22 are paired into two pairs. One of the pair, lift pins 22a and 22a' (the two located on the left in FIG. 2C) are arranged at an interval such that the two lines connecting the lift pins 22a and 22a' with the center of the plate 20 form an acute angle of 30 degrees. The other pair, lift pins 22b and 22b' (the two located on the right in FIG. 2C) are arranged at an interval such that the two lines connecting the lift pins 22b and 22b' with the center of the plate 20 form an obtuse angle of 120 degrees. The four lift pins 22 are disposed line-symmetrically with respect to an imaginary line passing through the center of the wafer W and extending in a horizontal direction in FIG. 2C. Such layout not only enables the lift pins 22 to stably support the wafer W but also allows the U-shaped transport arm 104 to enter beneath the wafer W for loading/unloading (from the right to the left in FIG. 2C) without being obstructed by the lift pins 22 (see FIGS. 2B and 10B). The lower surface of the lift pin plate 20 has a plurality of, for example three, rod-like connecting members 24 extending downward. The lower surface of the plate 20 here indicates the surface opposite to the surface having the lift pins 22. The connecting members 24 are arranged near the peripheral edge of the plate 20 at equal intervals in the circumferential direction of the plate 20.

Figure 4:
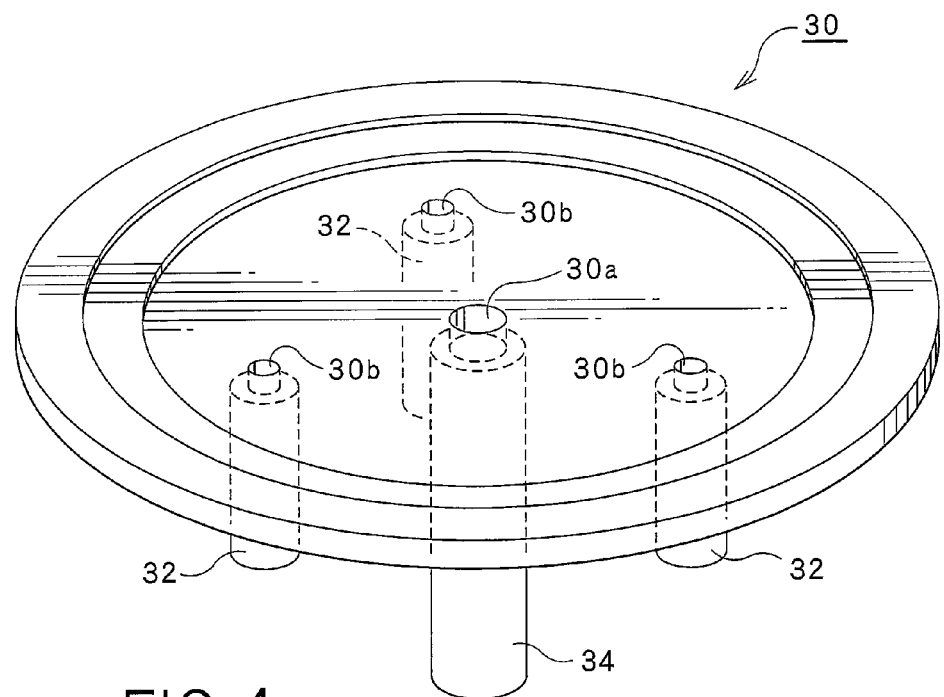
FIG. 4 is a perspective view showing the configuration of a retaining plate of the substrate cleaning apparatus shown in FIGS. 2A and 2B.

As shown in FIG. 4, the retaining plate 30 has a disk-like shape with the through-hole 30a formed in its central portion. The treatment fluid supply pipe 40 is routed through the through-hole 30a. A rotary cup 36 is attached to the retaining plate 30 via a connecting member 38 as shown in FIG. 2A.

When the lift pin plate 20, the treatment fluid supply pipe 40, and the bar-shaped nozzle 60 are at their lowered positions, the rotary cup 36 encircles the peripheral edge of the wafer W retained by the retaining plate 30. As shown in FIGS. 2A and 2C, two fixed retaining members 37 are attached to the rotary cup 36 to retain the wafer W. The detailed function of the fixed retaining members 37 will be described later. Instead of attaching the fixed retaining members 37 to the rotary cup 36, they may be connected to the retaining plate 30, or may be directly attached to the connecting member 38. If the fixed retaining members 37 are attached directly to the connecting member 38, the fixed retaining members 37 can be enhanced in strength against a force applied from a horizontal direction.

A hollow rotating shaft 34 is attached to the central portion of the lower surface of the retaining plate 30 (i.e., the surface opposite to the surface equipped with the rotary cup 36) to extend downward therefrom. The treatment fluid supply pipe 40 is accommodated in the cavity of the hollow rotating shaft 34. The rotating shaft 34 is supported by a bearing (not shown) and is rotated by the rotational driving unit 39 comprising an electric motor and so on. The rotational driving unit 39 rotates the rotating shaft 34, thus rotating the retaining plate 30 as well.

As shown in FIG. 4, three through-holes 30b (connecting member through-holes) are formed in the retaining plate 30. The connecting members 24 coupled to the lift pin plate 20 are each inserted slidably in the through-hole 30b. The connecting members 24 connect the retaining plate 30 and the lift pin plate 20 for their integral rotation while preventing relative rotation between them; the connecting members 24 permit relative vertical movement between the retaining plate 30 and the lift pin plate 20. The through-holes 30b are arranged in the retaining plate 30 at equal angular intervals on a circumference on the retaining plate 30. In addition, on the lower surface of the retaining plate 30, the through-holes 30b are provided with three accommodation members 32 having a cylindrical shape. The accommodation members 32 extend downward from the lower surface of the retaining plate 30 and accommodate the connecting members 24 extending downward from the lower surface of the lift pin plate 20. The accommodation members 32 are arranged at equal angular intervals on a circumference near a peripheral area of the retaining plate 30.

Figure 5:
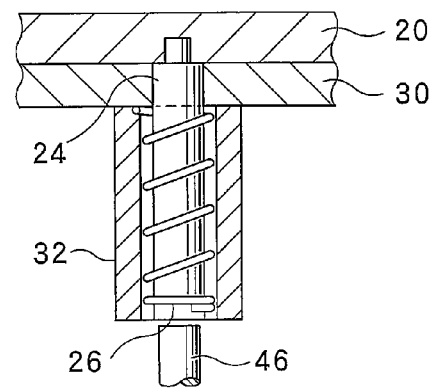
FIG. 5 is an enlarged vertical cross sectional view showing the configuration of a connecting member extending downward from the lift pin plate and a hollow accommodation member extending downward from the retaining plate and accommodating the connecting member in the substrate cleaning apparatus shown in FIGS. 2A and 2B.

Referring to FIG. 5, a further detailed description will be made for the connecting members 24 extending downward from the lower surface of the lift pin plate 20, and the accommodation members 32 extending downward from the lower surface of the retaining plate 30. As shown in FIG. 5, the cylindrical accommodation member 32 has an inside diameter slightly greater than an outside diameter of the connecting member 24. The connecting member 24 can move in a longitudinal direction of the accommodation member 32 (i.e., vertical direction in FIG. 5) in the accommodation member 32. As shown in FIG. 2A, when the lift pin plate 20 is at its lowered position, the connecting member 24 is completely received in the accommodation member 32. Meanwhile, as shown in FIG. 2B, when the lift pin plate 20 is at its raised position, only a lower portion of the connecting member 24 is received in the accommodation member 32. The connecting member 24 passes through the through-hole 30b in the retaining plate 30 and protrudes upward from the retaining plate 30.

As shown in FIG. 5, a spring 26 is installed in the cavity of the accommodation member 32 in a compressed state. The lower end of the spring 26 is connected to the bottom of the connecting member 24 while its upper end is connected to the lower surface of the retaining plate 30 in the vicinity of the through-hole 30b. Thus, the spring 26 urges the connecting member 24 downward. In other words, force of the spring 26 to return from the compressed state to an original state exerts a downward force upon the connecting member 24 (i.e., force to move downward from the retaining plate 30).

Figure 2A:
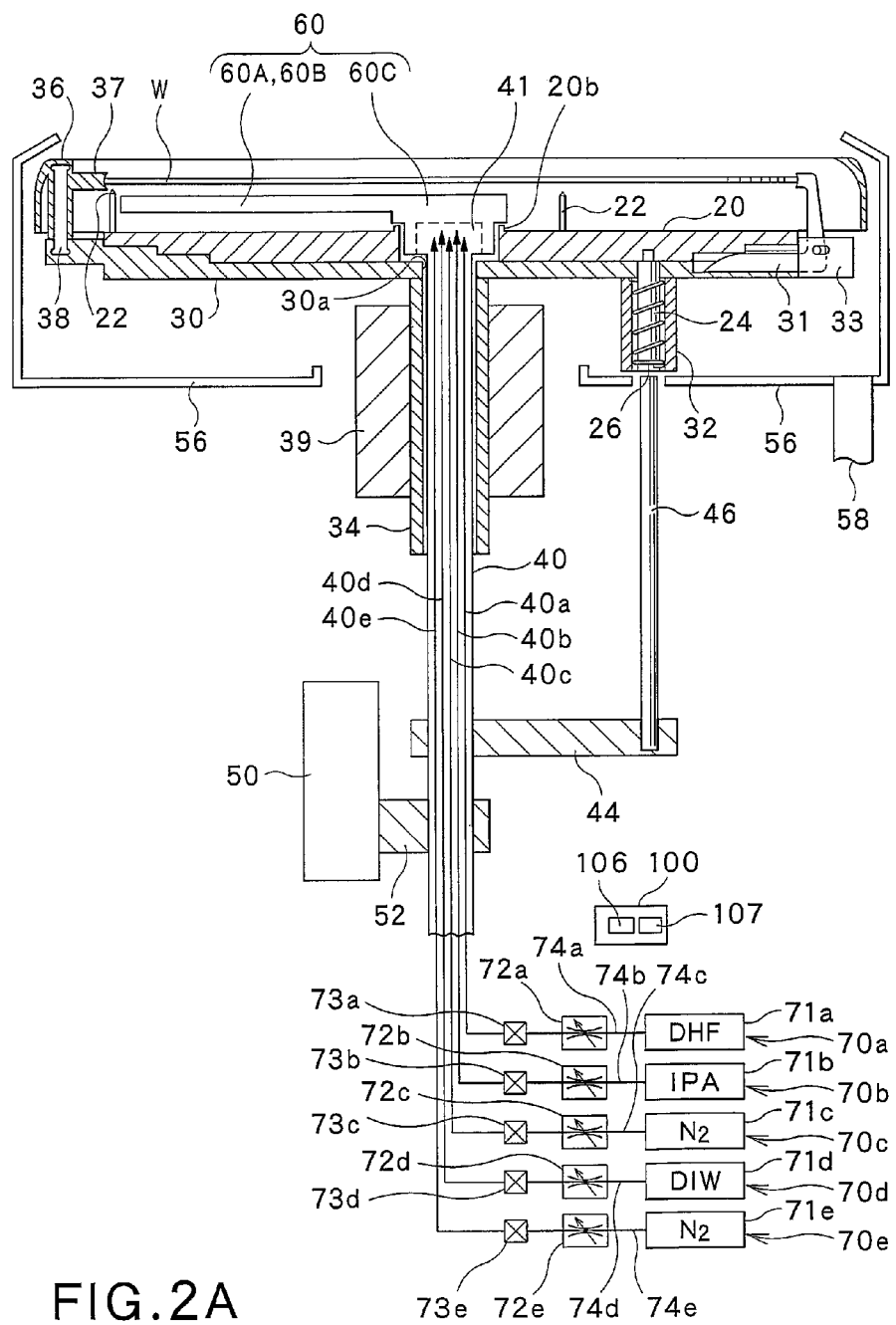
FIG. 2A is a vertical cross sectional view showing the configuration of the substrate cleaning apparatus in a state where a lift pin plate and a cleaning liquid supply pipe are located at their lowered positions.

As shown in FIGS. 2A and 2B, an outer cup 56 is provided outside the rotary cup 36 to surround the retaining plate 30 and the rotary cup 36. In addition, a drainage tube 58 is connected to the outer cup 56. During cleaning of a wafer W, used cleaning liquid scatters outward from the wafer W due to its rotation. The scattered liquid will be received by the outer cup 56 and is drained through the drainage tube 58.

As can be seen in FIG. 2A, a movable, substrate retaining member 31 for supporting the wafer W from the lateral side of the wafer W is provided on the retaining plate 30. When the lift pin plate 20 is at its lowered position as in FIG. 2A, the substrate retaining member 31 supports the wafer W from its lateral side. When the lift pin plate 20 is at its raised position as shown in FIG. 2B, the substrate retaining member 31 is separated away from the wafer W. The operation of the substrate retaining member 31 will be described more specifically with reference to FIG. 2C. During wafer cleaning, the wafer W is retained by the substrate retaining member 31 and the two fixed retaining members (i.e., non-movable, substrate-retaining members) 37. At this time, the substrate retaining member 31 presses the wafer W against the two fixed retaining members 37. That is, the substrate retaining member 31 applies to the wafer W a leftward force to press the wafer W against the fixed retaining members 37. In the illustrated embodiment, since the wafer W is retained by two fixed retaining members 37 and only one movable substrate-retaining member 31, the configuration for retaining the wafer W can be more simplified as compared with a configuration employing a plurality of movable substrate retaining members 31 with no fixed retaining member 37.

Figure 6:
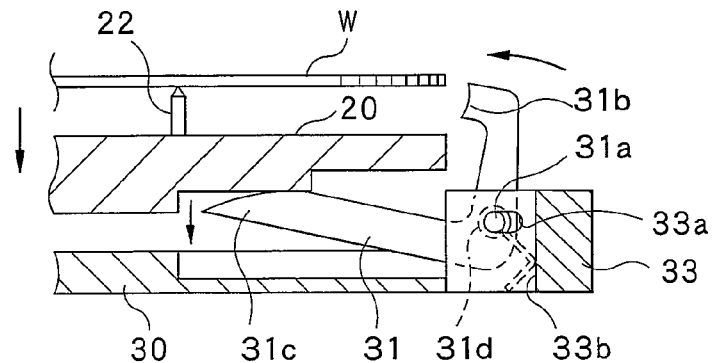
FIG. 6 is an enlarged vertical cross sectional view showing the configuration of the substrate retaining member provided on the retaining plate in the substrate cleaning apparatus shown in FIGS. 2A and 2B.
Figure 7:
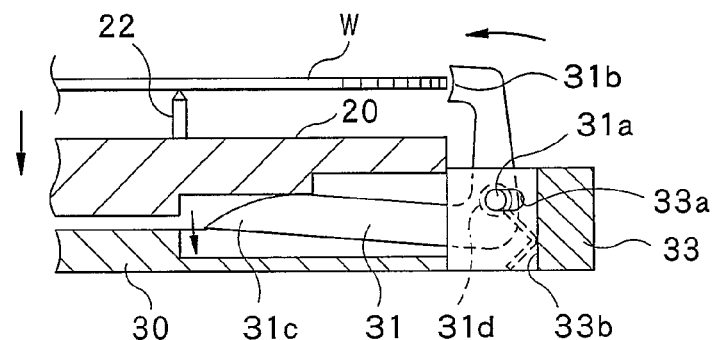
FIG. 7 is an enlarged vertical cross sectional view showing a state where the lift pin plate has been moved downward from the state shown in FIG. 6.
Figure 8:
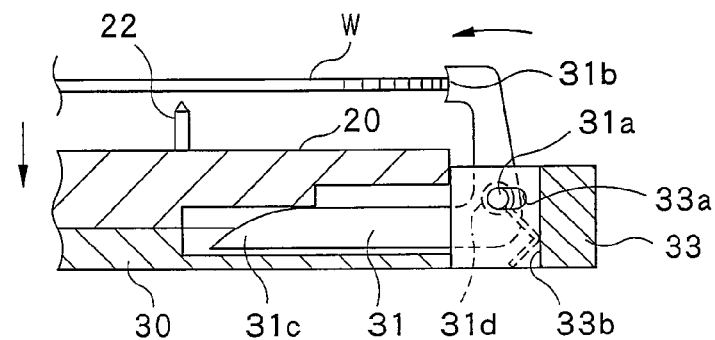
FIG. 8 is an enlarged vertical cross sectional view showing a state where the lift pin plate has been moved further downward from the state shown in FIG. 7.

Then, the configuration of the substrate retaining member 31 will be detailed below referring to FIGS. 6 to 8. FIG. 6 shows a state where the lift pin plate 20 is moving from its raised position as in FIG. 2B to its lowered position as in FIG. 2A. FIG. 7 shows a state where the lift pin plate has moved more downward from the state shown in FIG. 6. FIG. 8 shows a state where the lift pin plate 20 has moved further downward from the state of FIG. 7 to reach the lowered position as shown in FIG. 2A.

As shown in FIGS. 6 to 8, the substrate retaining member 31 is supported by the retaining plate 30 via an axle 31a. More specifically, a bearing unit 33 is attached to the retaining plate 30, and an axle receiving hole 33a of the bearing unit 33 receives the axle 31a. The axle receiving hole 33a is an elongated hole extending in a horizontal direction, and the substrate retaining member 31 can move horizontally along the axle receiving hole 33a. The substrate retaining member 31 can thus swing around the axle 31a accommodated within the axle receiving hole 33a of the bearing unit 33.

A spring member 31d such as a torsion spring is wound around the axle 31a of the substrate retaining member 31. The spring member 31d is adapted to impart the substrate retaining member 31 a force to rotate the substrate retaining member 31 around the axle 31a in the clockwise direction in FIGS. 6 to 8. Thus, when no force is applied to the substrate retaining member 31, the substrate retaining member 31 inclines with respect to the retaining plate 30, as shown in FIG. 2B. A substrate retaining portion 31b (described later) of the substrate retaining member 31, provided to hold the wafer W from its lateral side, then moves away from a central portion of the retaining plate 30.

The spring member 31d has a linear portion extending outward from the axle 31a to an inner wall 33b of the bearing unit 33. The linear portion is engaged with the inner wall 33b, thereby pushing back the axle 31a towards the center of the retaining plate 30. The axle 31a is thus constantly pushed towards the center (leftward in FIGS. 6 to 8) of the retaining plate 30 by the linear portion of the spring member 31d. When the movable substrate retaining member 31 and the fixed retaining members 37 are supporting a wafer W having a relatively small diameter, the axle 31a is positioned in the axle receiving hole 33a at a position nearer to the center (left side) of the retaining plate 30, as shown in FIGS. 6 to 8. When the movable substrate-retaining member 31 and the fixed retaining members 37 are supporting a wafer W having a relatively large diameter, the axle 31a moves rightward along the axle receiving hole 33a from the position shown in FIGS. 6 to 8, against the force applied by the linear portion of the spring member 31d. The magnitude of the wafer diameter (small/large diameter) here refers to a magnitude that falls within a tolerance range.

The substrate retaining member 31 has, in addition to the substrate retaining portion 31b that retains the wafer W from its lateral side, a pressure receiving member 31c at the side opposite to the substrate retaining portion 31b with respect to the axle 31a. The pressure receiving member 31c is set between the lift pin plate 20 and the retaining plate 30. When the lift pin plate 20 is at or near the lowered position, the lower surface of the lift pin plate 20 pushes the pressure-receiving member 31c downward as shown in FIGS. 6 to 8.

While the lift pin plate 20 moves from its raised position to its lowered position, the lower surface of the lift pin plate 20 pushes the pressure receiving member 31c downward. Then, the substrate retaining member 31 rotates counterclockwise around the axle 31a (in a direction shown by the arrows in FIGS. 6 to 8). This rotation of the substrate retaining member 31 around the axle 31a renders the substrate retaining portion 31b to approach the wafer W from its lateral side. The wafer W is held from its lateral side by the substrate retaining member 31, as the lift pin plate 20 reaches the lowered position as in FIG. 8. At this time when the wafer W is held at its lateral side by the substrate retaining member 31, the wafer W is separated from the tip of each lift pin 22 and is held above the lift pins 22. Depending on the size of the wafer W, the axle 31a may slide rightwards along the axle receiving hole 33a from the position shown in FIGS. 6 to 8, against the force applied by the linear portion of the spring member 31d. Therefore, the wafer W can be held from its lateral side without deforming nor damaging it even if the substrate retaining member 31 and the fixed retaining members 37 hold a relatively large wafer W, because the substrate retaining member 31 can shift in the horizontal direction.

By employing such substrate retaining member 31, the substrate cleaning apparatus 10 does not need a special driving mechanism (motive energy source) for driving a substrate retaining member 31. The substrate retaining member 31 of the retaining plate 30 can retain and release a wafer W just by vertically moving the lift pin plate 20 using a vertical driving unit 50 (described later). The configuration of the substrate cleaning apparatus 10 can thus be simplified. It also reduces the time lag between the timing of raising and lowering of the lift pin plate 20 and the timing of the action of the substrate retaining member 31, whereby improving throughput.

As shown in FIGS. 2A and 2B, the treatment fluid supply pipe 40 is arranged to pass through both the through-hole 20a in the lift pin plate 20 and the through-hole 30a in the retaining plate 30. The treatment fluid supply pipe 40 is arranged such that it does not rotate when the lift pin plate 20 and the retaining plate 30 rotate. A plurality of (five, in the illustrated embodiment), fluid supply passages for supplying treatment fluids to the V-shaped nozzle 60 are accommodated inside the treatment fluid supply pipe 40. The five fluid supply passages are: a first fluid supply passage 40a (also termed as "DHF (diluted hydrofluoric acid) supply passage"); a second fluid supply passage 40b (also termed as "IPA (isopropyl alcohol) supply passage"); a third fluid supply passage 40c (also termed as "first $N_2$ gas supply passage"); a fourth fluid supply passage 40d (also termed as "DIW (deionized water) supply passage"); a fifth fluid supply passage 40e (also termed as "second $N_2$ gas supply passage"). These five fluid supply passages extend in a vertical direction inside the treatment fluid supply pipe 40. The V-shaped nozzle 60 which will be detailed later is attached on the upper end of the treatment fluid supply pipe 40.

As shown in FIG. 2A, the first to sixth fluid supply passages 40a, 40b, 40c, 40d, 40e in the treatment fluid supply pipe 40 are connected to corresponding first to sixth fluid supply mechanisms 70a, 70b, 70c, 70d, 70e, respectively.

The first fluid supply mechanism 70a is for supplying DHF (diluted hydrofluoric acid) and is hereinafter referred to as a DHF supply mechanism 70a. The DHF supply mechanism 70a is connected to a DHF supply source 71a via a line 74a which is provided with, from the upstream, a variable throttle valve 72a and an open/close valve 73a.

The second fluid supply mechanism 70b is for supplying IPA (isopropyl alcohol) and is hereinafter referred to as IPA supply mechanism 70b. The IPA supply mechanism 70b is connected to an IPA supply source 71b via a line 74b which is provided with, from the upstream, a variable throttle valve 72b and an open/close valve 73b.

The third fluid supply mechanism 70c is for supplying an inert gas such as $N_2$ gas and is hereinafter referred to as first $N_2$ gas supply mechanism 70c. The first $N_2$ gas supply mechanism 70c is connected to a $N_2$ gas supply source 71c via a line 74c which is provided with, from the upstream, a variable throttle valve 72c and an open/close valve 73c.

The fourth fluid supply mechanism 70d is for supplying DIW (deionized water) as a rinse liquid and is hereinafter termed as DIW supply mechanism 70d. The DIW supply mechanism 70d is connected to a DIW supply source 71d via a line 74d which is provided with, from the upstream, a variable throttle valve 72d and an open/close valve 73d.

The fifth fluid supply mechanism 70e is for supplying an inert gas such as $N_2$ gas and is hereinafter referred to as second $N_2$ gas supply mechanism 70e. The second $N_2$ gas supply mechanism 70e is connected to a $N_2$ gas supply source 71e via a line 74e which is provided with, from the upstream, a variable throttle valve 72e and an open/close valve 73e.

Figure 9:
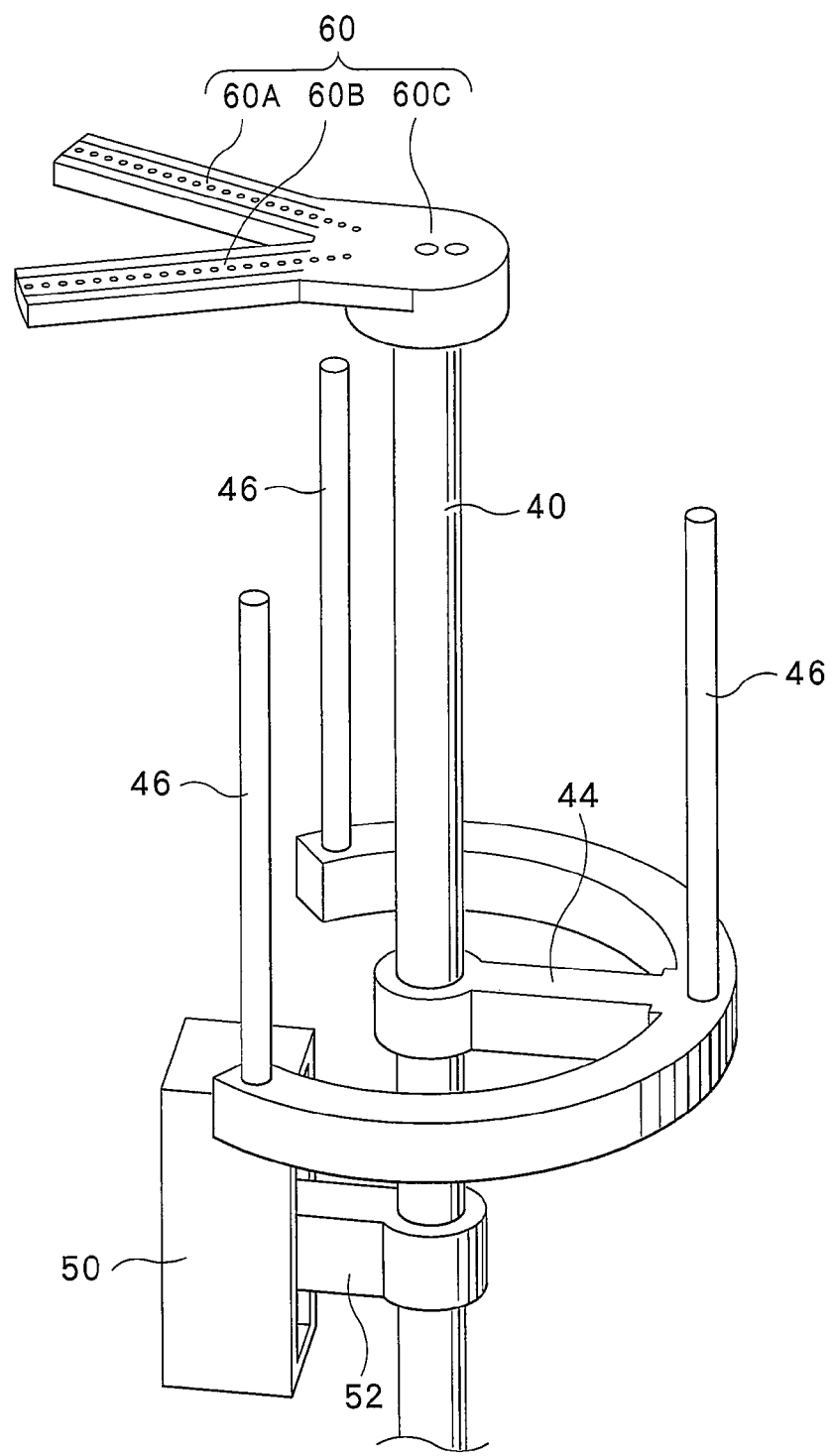
FIG. 9 is a perspective view showing the configuration of a treatment fluid supply pipe and bar-shaped nozzle in the substrate cleaning apparatus shown in FIGS. 2A and 2B, and the configuration of a lifting mechanism for vertically moving them.

As shown in FIGS. 2A, 2B, and 9, the vertical driving unit 50 is connected with the treatment fluid supply pipe 40 via a connecting member 52. The vertical driving unit 50 is configured to move the treatment fluid supply pipe 40 vertically. That is, by raising/lowering the connecting member 52, the vertical driving unit 50 moves the treatment fluid supply pipe 40 and bar-shaped nozzle 60 connected to the connecting member 52. More specifically, the vertical driving unit 50 raises/lowers the treatment fluid supply pipe 40 and the bar-shaped nozzle 60 between their lowered positions as in FIG. 2A and their raised positions as in FIG. 2B.

As shown in FIG. 9, the treatment fluid supply pipe 40 is further attached with a first interlocking member 44. Three rod-shaped second interlocking members 46 are connected to the first interlocking member 44 to extend upward therefrom. The second interlocking members 46 are arranged to correspond to the connecting members 24 extending downward from the lift pin plate 20. The outer diameter of the second interlocking member 46 is smaller than the inner diameter of the cylindrical accommodation member 32. That is to say, each second interlocking member 46 is arranged to contact the bottom of one connecting member 24 so that the second interlocking member 46 can push the connecting member 24 upward within the accommodation member 32, as shown in FIG. 2B.

Accordingly, when the vertical driving unit 50 moves the treatment fluid supply pipe 40 upward from the state shown in FIG. 2A, the first interlocking member 44 and second interlocking members 46 joined with the treatment fluid supply pipe 40 also moves upward so that the second interlocking members 46 push the connecting members 24 upward inside the accommodation members 32, whereby the lift pin plate 20 moves integrally with the treatment fluid supply pipe 40 so that the lift pin plate 20, the treatment fluid supply pipe 40, and the bar-shaped nozzle 60 thus reach their raised positions as in FIG. 2B. On the other hand, when the vertical driving unit 50 moves the treatment fluid supply pipe 40 downward from the state shown in FIG. 2B, since the spring 26 set within the accommodation member 32 constantly applies a downward force to the connecting member 24, the connecting member 24 descends downward integrally with the interlocking member 46 with its bottom being in contact with the top of the second interlocking member 46. The lift pin plate 20, the treatment fluid supply pipe 40, and the bar-shaped nozzle 60 thus reach their respective lowered positions as in FIG. 2A.

The lift pin plate 20 adjoins the retaining plate 30 when the lift pin plate 20 is positioned at its lowered position, as shown in FIG. 2A. In the illustrated embodiment, the lift pin plate 20 is rested on and supported by the retaining plate 30. On the other hand, the lift pin plate 20 is separated from the retaining plate 30 when the lift pin plate 20 is positioned at its raised position, as shown in FIG. 2B. The wafer W is then supported by the lift pins 22 and can be removed therefrom.

As mentioned above, the liquid treatment apparatus includes an interlocking mechanism having the first interlocking member 44 and the three second interlocking members 46 for integrally raising and lowering the lift pin plate 20, the treatment fluid supply pipe 40, and the bar-shaped nozzle 60. The liquid treatment apparatus also includes a lifting mechanism for integrally raising and lowering the lift pin plate 20, the treatment fluid supply pipe 40, and the bar-shaped nozzle 60 relative to the retaining plate 30 by employing the first interlocking member 44, the three second interlocking members 46, the vertical driving unit 50 and the connecting member 52.

Next, the configuration of the V-shaped nozzle 60 is described with reference to FIGS. 2A, 2B, 9, and 10A and 10B. The V-shaped nozzle 60 has a first bar-shaped portion 60A, a second bar-shaped portion 60B, and a central portion 60C. The first bar-shaped portion 60A and the second bar-shaped portion 60B are each connected to the central portion 60C in an arrangement such that the two form a V-shaped figure. The first bar-shaped portion 60A extends from a position opposing to a peripheral portion of the wafer W towards a position opposing to the central portion of the wafer W. Similarly, the second bar-shaped portion 60B extends from a position opposing to a peripheral portion of the wafer W towards a position opposing to the central portion of the wafer W. The V-shaped nozzle 60 is attached on the upper end of the treatment fluid supply pipe 40 at its central portion 60C. The central portion 60C also serves as a cover member for covering the through-hole 20a in the lift pin plate 20. The bar-shaped portions 60A and 60B extend from the central portion 60C radially outward of the lift pin plate 20, that is, radially outward of the wafer W, and terminate just short of an imaginary circumference on which the lift pins 22 are arranged.

This ensures that the bar-shaped portions 60A, 60B would not interfere with the lift pins 22 during treatment (during treatment, the V-shaped nozzle 60 does not rotate while the lift pin plate 20 rotates).

Figure 10A:
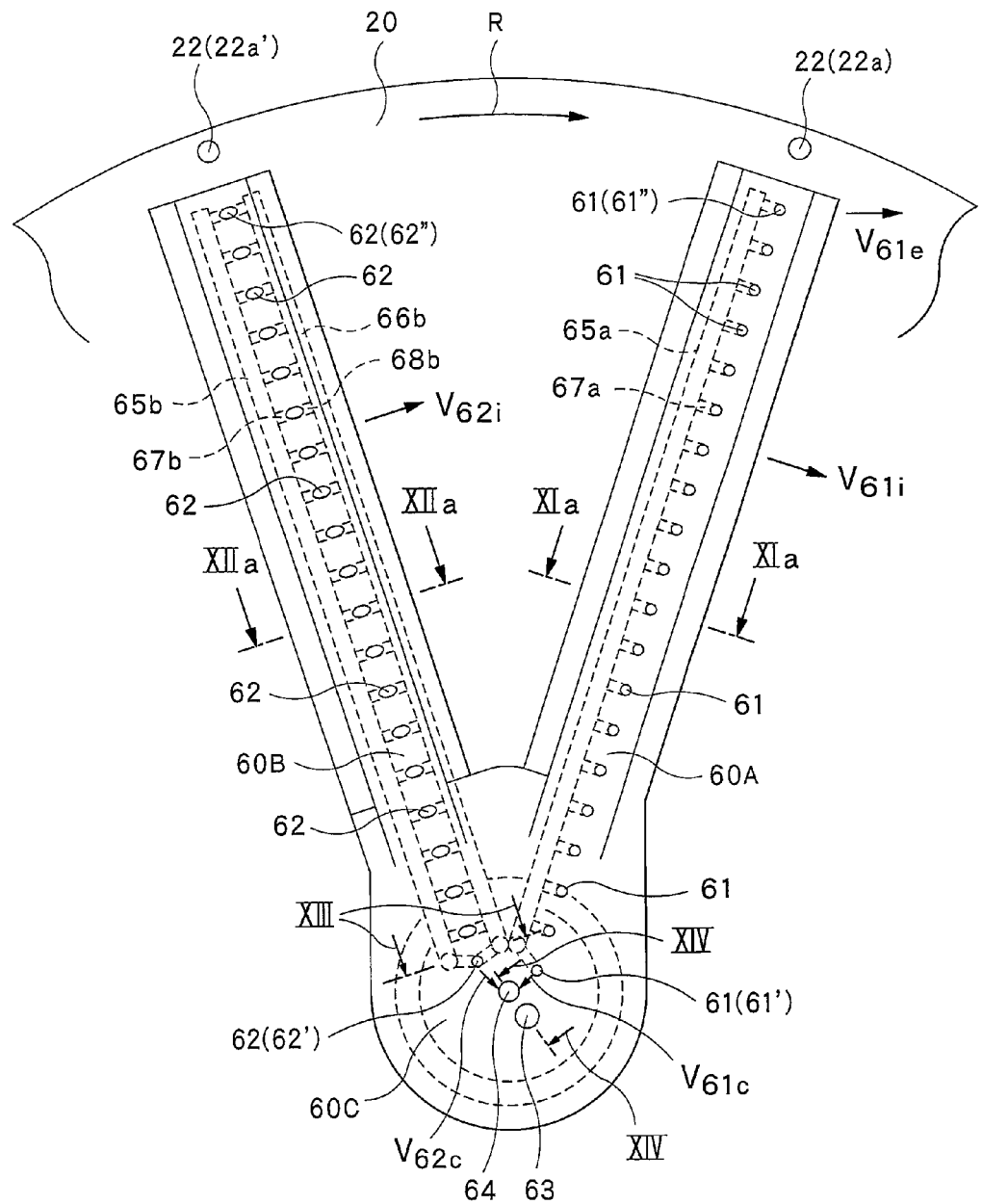
FIG. 10A is a plan view showing the V-shaped nozzle.
Figure 10B:
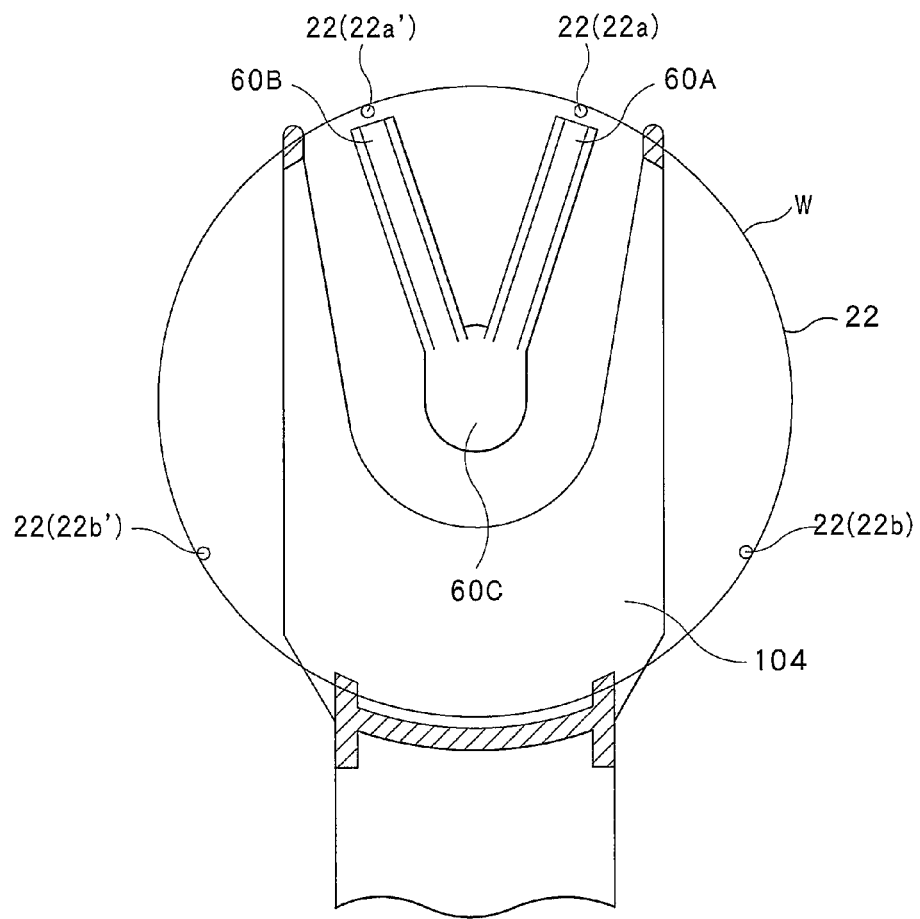
FIG. 10B is a schematic plan view illustrating a positional relationship between the V-shaped nozzle, lift pins, and a transport arm at a time when the wafer is transferred between the lift pin plate and the transport arm.

In the embodiment of FIG. 10A, the first bar-shaped portion 60A and the second bar-shaped portion 60B form an angle of 30 degrees, for example (not limited to this angle). Therefore, by setting the lift pin plate 20 and the retaining plate 30 at certain angular positions, the lift pins 22a, 22a' can be set in positions at which extended lines of the first and the second bar-shaped portion 60A, 60B respectively meet with the lift pins 22a, 22a'. A clearance between the lower wafer W surface and the V-shaped nozzle 60 is very narrow as can be seen in FIG. 2B. In terms of avoiding collision between the transport arm 104 and the V-shaped nozzle 60, it is thus preferable that the transport arm 104 and the V-shaped nozzle 60 do not overlap in a top plan view during wafer loading/unloading. If the lift pins 22a, 22a' and the first and second bar-shaped portion 60A, 60B are in a positional relationship as shown in FIG. 10A, the transport arm 104 can be easily inserted under the wafer without contacting the four lift pins nor the V-shaped nozzle 60 as in FIG. 10B. When the transport arm 104 is inserted under the wafer, the two distal end of the arm 104 pass through outside of the lift pins 22a, 22a' and inside the lift pins 22b, 22b'. The above is one advantage obtained by arranging the first bar-shaped portion 60A and the second bar-shaped portion 60B into the V-shaped configuration.

Figure 11:
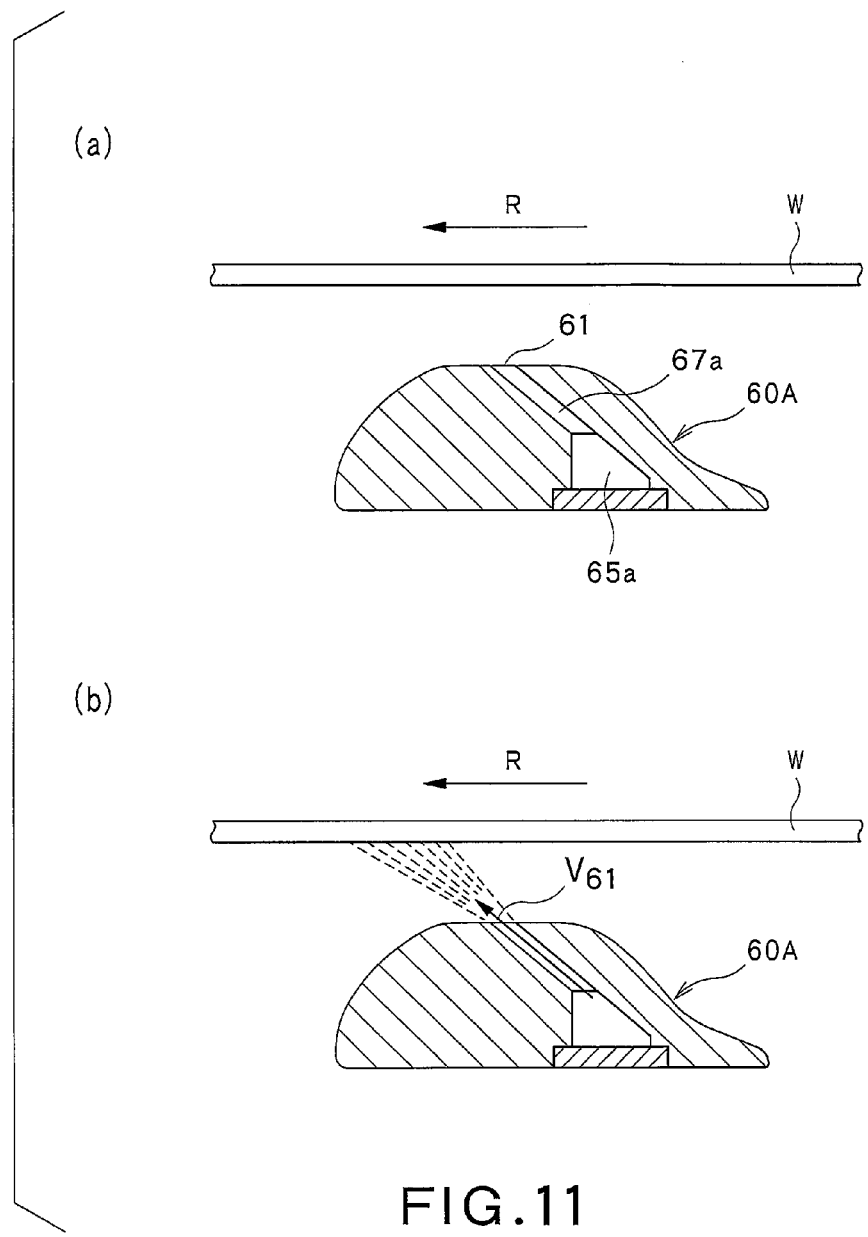
FIG. 11 is for explanation of the configuration and the function of a first bar-shaped portion of the V-shaped nozzle, wherein (a) is a cross-sectional view taken along line XIa-XIa in FIG. 10A showing the internal structure of the first bar-shaped portion, and (b) is a schematic view showing the condition of DHF ejected from the first bar-shaped portion.

As shown in FIGS. 11(*a*) and 12(*a*), the first bar-shaped portion 60A and the second bar-shaped portion 60B have a cross-sectional shape resembling an airfoil. In the illustrated liquid treatment apparatus, the wafer W rotates in a direction of the arrow R in FIGS. 11(*a*), 12(*a*) with respect to the bar-shaped portions 60A and 60B. This rotation generates an airflow in the direction of the arrow R between the lower wafer W surface and the lift pin plate 20. The airflow passes though the space above the bar-shaped portions 60A, 60B with the cross section of an airfoil to improve the flow of the liquid. More specifically, as the airflow passes through the space between the rear of the bar-shaped portions 60A, 60B and the wafer W, the airflow is narrowed down. The airflow will be accelerated and also rectified to a direction towards the lower wafer W surface. Such airflow assists the treatment liquid (e.g., a chemical liquid) collided with the lower wafer W surface to spread more smoothly over the surface. In addition, since the bar-shaped portion 60A has the cross section like an airfoil, vibration of the bar-shaped portion 60A due to the airstream can be suppressed to a minimum.

The V-shaped nozzle 60 includes a plurality of first ejection ports 61 arranged between a position opposing to a central portion of the wafer W and a position opposing to a peripheral portion of the wafer W. The first ejection ports 61 are for ejecting DHF towards the wafer W. The first ejection ports 61 are arranged in a row in a longitudinal direction of the first bar-shaped portion 60A from the central portion 60C to the distal end of the first bar-shaped portion 60A. The V-shaped nozzle 60 also includes a plurality of second ejection ports 62 arranged between a position opposing to a central portion of the wafer W and a position opposing to a peripheral portion of the wafer W. The second ejection ports 62 are for ejecting a two-fluid spray comprising a mixture fluid of IPA and $N_2$ gas towards the wafer W. The second ejection ports 62 are arranged in a row in a longitudinal direction of the second bar-shaped portion 60B from the central portion 60C to a distal end of the second bar-shaped portion 60B. In addition, the V-shaped nozzle 60 includes a third ejection port 63 in the central portion 60C. The third ejection port 63 is for ejecting DIW towards the central portion of the wafer W. The V-shaped nozzle 60 further includes a fourth ejection port 64 in the central portion 60C. The fourth ejection port 64 is for ejecting $N_2$ gas towards the central portion of the wafer W. The fourth ejection port 64 is positioned almost directly below the center of the wafer W retained by the retaining plate 30.

Diameters of the first and second ejection ports 61, 62 and those of the ejecting passages 67a, 67b, 68a, 68b connected to the ejection ports 61, 62 are small (about 0.3 to 0.5 mm). Therefore the liquid becomes electrically charged due to friction caused by the liquid passing through the ejection ports and the ejecting passages. This may be prevented by forming the V-shaped nozzle 60 from an electrically conductive material such as PFA containing carbon fibers.

Figure 14:
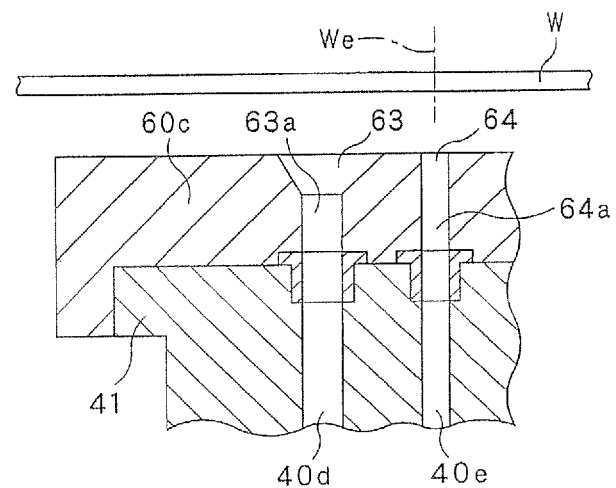
FIG. 14 is a cross-sectional view taken along line XIV-XIV in FIG. 10A to show the structure of the central portion of the V-shaped nozzle.

As shown in FIG. 14, the treatment fluid supply pipe 40 has, at its upper end, a head 41 of an enlarged diameter. The central portion 60C of the V-shaped nozzle 60 is coupled to the head 41 of the treatment fluid supply pipe 40 by a screw not shown.

As shown in FIG. 14, as the central portion 60C and the head become coupled together, the DIW supply passage 40d extending vertically inside the treatment fluid supply pipe 40 communicates with an ejecting passage 63a extending vertically inside the central portion 60C. The DIW can thus be fed via the DIW supply passage 40d to the third ejection port 63 and ejected towards the lower surface of the wafer W. The third ejection port 63 has a shape that ensures the DIW ejected therefrom to reach the wafer center We on the lower wafer W surface. The second $N_2$ gas supply passage 40e extending vertically inside the treatment fluid supply pipe 40 and an ejecting passage 64a extending vertically inside the central portion 60C are also communicated with each other as the central portion 60C is coupled to the head 41. The $N_2$ gas can thus be supplied via the second $N_2$ gas supply passage 40e to the fourth ejection port 64 and ejected towards the lower surface of the wafer W.

Figure 13:
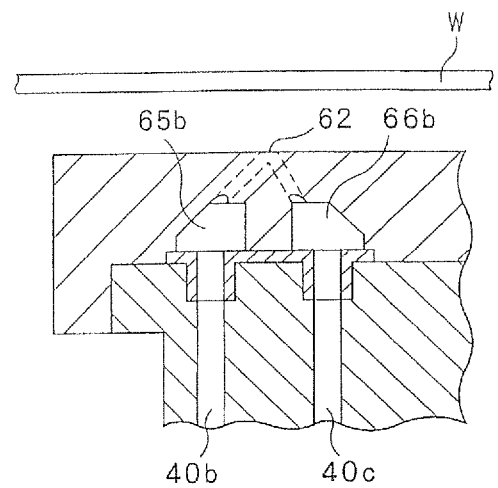
FIG. 13 is a cross-sectional view taken along line XIII-XIII in FIG. 10A showing the structure of a central portion of the V-shaped nozzle.

In addition, when the central portion 60C is coupled to the head 41, the IPA supply passage 40b extending vertically inside the treatment fluid supply pipe 40 communicates with a fluid passageway (IPA passageway) 65b formed in the V-shaped nozzle 60, and the first $N_2$ gas supply passage 40c extending vertically inside the treatment fluid supply pipe 40 communicates with a fluid passageway ($N_2$ gas passageway) 66b formed in the V-shaped nozzle 60, as shown in FIG. 13. As indicated by dashed lines in FIG. 10A, the IPA passageway 65b and the $N_2$ gas passageway 66b are parallel to each other and extend horizontally from the central portion 60C of the V-shaped nozzle 60 to the distal end of the second bar-shaped portion 60B in the longitudinal direction. Although not illustrated in details, when the central portion 60C is coupled to the head 41, the DHF supply passage 40a extending vertically inside the treatment fluid supply pipe 40 also communicates with a fluid passageway (DHF passageway) 65a formed in the V-shaped nozzle 60 in the same manner as that shown in FIG. 13 (but only one passageway and one passage are connected). As indicated by dashed lines in FIG. 10A, the DHF passageway 65a extends horizontally from the central portion 60C of the V-shaped nozzle 60 to the distal end of the second bar-shaped portion 60A in the longitudinal direction thereof.

As shown in FIG. 11(a), in the central portion 60C and in the first bar-shaped portion 60A of the V-shaped nozzle 60, each of the ejection ports 61 is connected with respective ones of the DHF ejecting passages 67a, which are connected to the DHF passageway 65a. Thus, DHF is ejected from each ejection port 61. As shown in FIG. 11(b), each ejection port 61 is preferably configured to eject the DHF in a direction inclined to the rotating direction R of the wafer W. In other words, it is preferable that a vector V61 representing the direction in which the DHF is ejected has a component of the rotating direction R of the wafer W. This suppresses bouncing (splash-back) of the DHF upon its collision with the lower wafer W surface and in turn reduces waste and increases effectiveness of DHF usage. Since the vector indicating the ejecting direction of the DHF has the component of the rotating direction of the wafer W, the ejected DHF is less likely to drop from the wafer W onto the V-shaped nozzle 60. This is because the DHF tends to drop from the wafer W at the instant and immediately after the DHF has reached the wafer W. The fact that the vector representing the ejecting direction of the DHF has the component of the rotating direction of the wafer W (in other words, the DHF is ejected in a direction away from the second bar-shaped portion 60B) is also advantageous in that undesirable adhesion of the DHF onto the second bar-shaped portion 60B can be prevented or suppressed. Incidentally, most of the ejection ports 61 are preferred to be formed so that the vector V61 indicating the ejecting direction of the DHF from the ejection ports 61 has the component of the wafer rotational direction and the vector V61 is oriented in a direction orthogonal to the longitudinal direction of the first bar-shaped portion 60A. On the other hand, one radially outermost ejection port 61" or some ejection ports 61 including the port 61" may instead be configured to eject DHF in a direction such that the vector V61 representing the ejecting direction has a component of a radially outward direction as the arrow V61e in FIG. 10A. Used DHF can then be swept away from the wafer W smoothly. In addition, one radially innermost ejection port 61' or some ejection ports 61 including the port 61' may be formed to eject DHF in a direction such that a vector V61 representing the ejecting direction is oriented radially inward as shown by the arrow V61c in FIG. 10A. This ensures that there is no non-treated region in the central portion of the wafer W.

As shown in FIG. 12(a), at the central portion 60C and second bar-shaped portion 60B of the V-shaped nozzle 60, each ejection port 62 is connected with one IPA ejecting passage 67b and one $N_2$ gas ejecting passage 68b which are each communicated with the IPA passageway 65b and the first $N_2$ gas passageway 66b, respectively. The IPA ejecting passage 67b and the first $N_2$ ejecting passage 68b meet at a position near the ejection port 62.

When both the IPA and the $N_2$ gas are supplied from the IPA passageway 65b via the IPA ejecting passage 67b and from the $N_2$ gas passageway 66b via the $N_2$ gas ejecting passage 68b, the IPA flow and the $N_2$ gas flow collide and mixed with each other at a junction of the IPA ejecting passage 67b and the $N_2$ gas ejecting passage 68b, in other words, at a position of the ejection port 62, whereby liquid droplets comprising a mixed fluid of IPA and $N_2$ gas, i.e., IPA mist is formed. As shown in FIG. 12(b), the IPA mist is ejected upward from the ejection port 62 while spreading in a fan-like fashion. It is preferable that the radially innermost one or some ejection ports 62, notably the one radially innermost ejection ports 62', is configured to eject the IPA mist therefrom such that a vector V62 representing the ejecting direction of the IPA from that port is oriented to the center of the wafer W as shown by the arrow labeled V62c in FIG. 10A.

Figure 15:
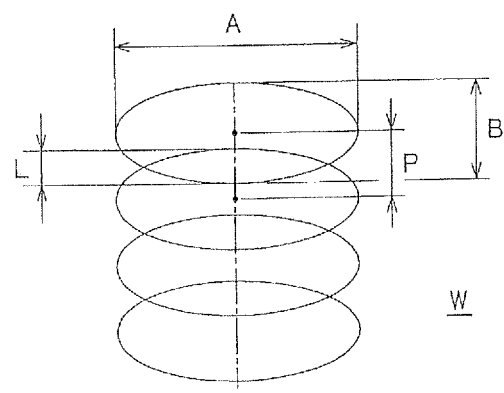
FIG. 15 is a schematic plan view showing spots on the lower wafer surface formed by a treatment fluid ejected from the V-shaped nozzle.

The plurality of ellipses in FIG. 15 each represent an area where an ejected treatment fluid (DHF) covers on the lower surface of the wafer W at the instant of reaching the surface (this area is hereinafter also referred to as "spot"). After reaching the lower surface of the wafer W, the treatment fluid ejected from the ejection port 61 or 62 spreads on the surface due to factors such as a centrifugal force of the wafer W rotation and the pressure of jetting from the ejection port 61, 62. Since the treatment fluids are ejected out obliquely upward from the ejection ports 61 and 62, the shapes of the spots are elliptical. On the other hand, the IPA mist comprising IPA and $N_2$ gas forms a circular spot having a relatively large diameter. The pitch P between the centers of elliptical spots is equivalent to an arrangement pitch of the ejection ports 61 and 62. Since an ejected treatment fluid diffuses before reaching the wafer, a minor axis of each ellipse has a length B greater than a diameter of the ejection port 61 or 62. Length A of a major axis of the ellipse is much greater than the diameter of the ejection port 61. In the case of ejecting a chemical liquid such as DHF, it is also preferable to configure the ejection ports 61, 62 in such a way that adjacent spots have an overlapped portion of a length L for the sake of achieving uniform treatment. However, if the chemical liquids forming adjacent spots are to merge immediately, the adjacent spots need not overlap with each other.

As shown in FIG. 10A, the V-shaped nozzle 60 includes the first bar-shaped portion 60A and second bar-shaped portion 60B arranged in a V-shaped figure. The first bar-shaped portion 60A having the ejection ports 61 for ejecting DHF is arranged at a position advanced or rotated through an acute angle (30 degrees in the illustrated embodiment) in the rotational direction R of the wafer W from the second bar-shaped portion 60B for ejecting IPA mist comprising IPA and $N_2$ gas. This layout is advantageous in terms of maintaining the V-shaped nozzle 60 clean. There is an airflow traveling in the wafer rotation direction R under the lower surface of the wafer W, with which the liquids ejected from the ejection ports 61 and 62 flow. Part of the liquids ejected from the ejection port 61 and reach the wafer W will drop therefrom due to gravity. If the positions of the first bar-shaped portion 60A and second bar-shaped portion 60B were reversed from those shown in FIG. 10A, the DHF ejected from the first bar-shaped portion 60A and reaction products are more likely to adhere to the second bar-shaped portion 60B for ejecting the IPA mist comprising IPA and $N_2$ gas. It is unfavorable that the second bar-shaped portion 60B for ejecting a drying fluid is contaminated with the DHF and the reaction products. Thus, it is advantageous to arrange the second bar-shaped portion 60B at a position advanced through a large angle (330 degrees in the illustrated embodiment) in the wafer rotational direction R from the first bar-shaped portion 60A. In other words, the first bar-shaped portion 60A is advantageously arranged at a position advanced through a small angle (330 degrees in the illustrated embodiment) in the wafer rotational direction R from second bar-shaped portion 60B.

The substrate cleaning apparatus 10 includes a controller 100 that controls the whole operation of the apparatus. The controller 100 controls operation of all functional components of the substrate cleaning apparatus 10 (e.g., the rotational driving unit 39, the vertical driving unit 50, the first to fifth fluid supply mechanisms 70a to 70e, etc.). The controller 100 can be implemented with hardware such as a general-purpose computer, and a program as software for controlling the computer (apparatus control program, processing recipe, etc.). The software may be stored in a hard-disk drive or other storage medium fixedly provided in the computer, or may be stored in a storage medium removably set in the computer such as a CD-ROM, DVD, flash memory. Such a storage medium is denoted with reference number 106. Upon receipt of instructions from a user interface (not shown), a processor 107 calls up a required processing recipe from the storage medium 106 and executes the recipe. The controller 100 thereby controls and operates the functional components of the substrate cleaning apparatus 10 to perform a predetermined process (treatment). Alternatively, the controller 100 may be a system controller that controls the whole operations of the liquid treatment system shown in FIG. 1.

Next, a series of process steps of a cleaning treatment (process) performed by the substrate cleaning apparatus 10 for removing a natural oxide film ($SiO_2$ film) from a wafer surface will be described.

<Wafer Loading and Placing Step>

First, the vertical driving mechanism 86 moves the lift pin plate 20, the treatment fluid supply pipe 40, and the V-shaped nozzle 60, to their respective upper positions shown in FIG. 2B. Next, as indicated by double-dashed lines in FIG. 2B, a wafer W is carried in from the outside of the substrate cleaning apparatus 10 by the transport arm 104 and the wafer W is rested onto the lift pins 22 of the lift pin plate 20, The vertical driving unit 50 then moves the treatment fluid supply pipe 40 and the V-shaped nozzle 60 from the upper positions to the lower positions, shown in FIG. 2A. At this time, since the spring 26 disposed inside the accommodation member 32 constantly exerts a downward force upon the connecting member 24, the lift pin plate 20 also moves from the upper position to the lower position together with the treatment fluid supply pipe 40. The lower surface of the lift pin plate 20 pushes down the pressure-receiving member 31c of the substrate retaining member 31 from the state of FIG. 6. The substrate retaining member 31 in turn rotates around the axle 31a in the counterclockwise direction of FIG. 6 to move the substrate retaining portion 31b towards the wafer W from its lateral side as shown in FIG. 7, whereby the substrate retaining member 31 and the fixed retaining member 37 hold the wafer W from its lateral side as shown in FIG. 8. The retained wafer W is then lifted upward to leave the lift pin 22. Before the wafer W is carried into the substrate cleaning apparatus 10, the wafer W is reversed by a reverser 105 (see FIG. 1) so that its "front surface" (the surface on which patterns are to be formed) comes to the "lower surface" and its "back surface" (the surface on which no patterns are to be formed) comes to the "upper surface". The wafer W is retained in this state by the retaining plate 30. In the present description, the term "upper surface" (or "lower surface") simply means a face that is facing upward (downward) at a particular point in time.

<DHF Cleaning Step>

Next, the rotational driving unit 39 is actuated to rotate the retaining plate 30. At this time, the connecting members 24 extending downward from the lower surface of the lift pin plate 20 are accommodated in the accommodation members 32 extending downward from the lower surface of the retaining plate 30. The lift pin plate 20 thus rotates together with the retaining plate 30 to rotate the wafer W as well. During the rotation, the treatment fluid supply pipe 40 and the V-shaped nozzle 60 attached thereto remain still and do not rotate. Next, DHF is supplied from the DHF supply mechanism 70a to the DHF supply passage 40a. The thus supplied DHF is ejected from the first ejection ports 61, and removes the natural oxide film on the wafer W. Together with the DHF, the reaction products flows radially outward along the lower surface of the wafer W due to centrifugal force, flows out of the wafer W, is received by the rotary cup 36 to change its flowing direction downward, and is discharged from the waste liquid drainage tube 58 connected at the bottom of the outer cup 56. During the DHF cleaning step, a DIV atmosphere is established below the wafer W. Since the wafer W acts as a shield for preventing the DHF atmosphere from diffusing into a space above the wafer W and the wafer W is surrounded by the rotary cup 36 and the outer cup 56, the DHF atmosphere will hardly diffuse out from the space surrounded by the lower surface of the wafer W and the inner surface of the outer cup 56. In addition, the DHF atmosphere existing in the space surrounded by the lower surface of the wafer W and the inner surface of the outer cup 56 is sucked into the waste liquid drainage tube 58 connected to the factory exhaust system (of a slightly reduced pressure), and is discharged together with the DHF drainage. Thus, diffusion of the DHF atmosphere into a space above the wafer W in the process chamber is prevented or suppressed. Therefore, corrosion of the process chamber inner wall and apparatus component parts due to the exposure of those members to the DHF atmosphere (which will result in generation of substances causing contamination) can be prevented.

<DIW Rinsing Step>

After performing the DI-IF cleaning for a predetermined time, the DHF ejection from the first ejection port 61 is stopped. While the wafer is kept rotating, the DIW supply mechanism 70*d* feeds DIW to the DIW supply passage 40*d* at a relatively high flow rate (e.g., 1,500 ml per minute). The DIW is then ejected towards the central portion of the wafer W from the third ejection port 63 provided in the central portion 60C of the V-shaped nozzle 60. The DIW flows radially outward along the lower surface of the wafer W due to centrifugal force, flows out of the wafer W, is received by the rotary cup 36 to change its flowing direction downward, and is discharged from the waste liquid tube 58 connected at the bottom of the outer cup 56. The DHF and reaction products remaining on the lower surface of the wafer W are thus removed by the DIW flowing radially outward along the surface.

<IPA Substituting Step>

Figure 12:
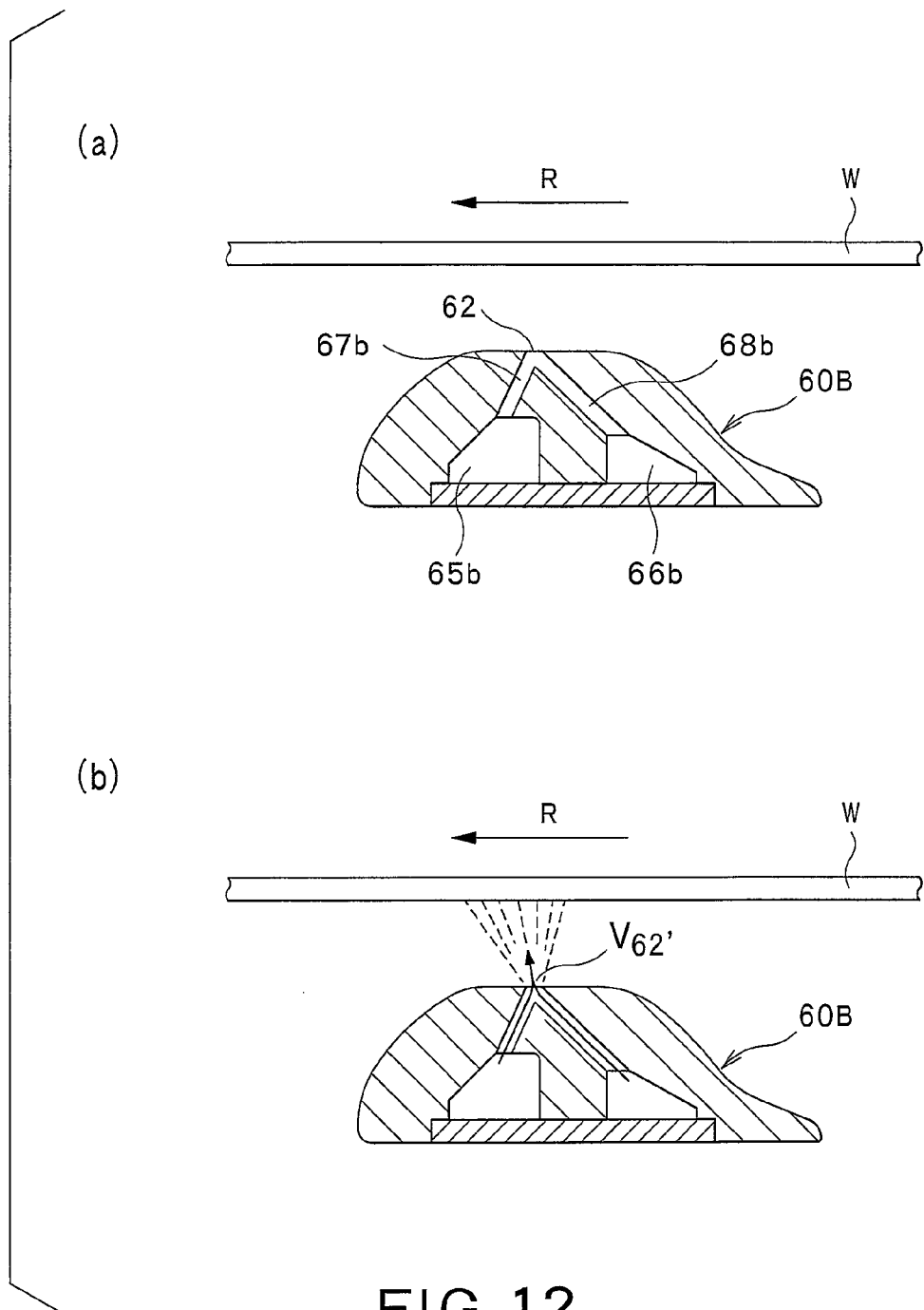
FIG. 12 is for explanation of the configuration and the function of a second bar-shaped portion of the V-shaped nozzle, wherein (a) is a cross-sectional view taken along line XIIa-XIIa in FIG. 10A showing the internal structure of the second bar-shaped portion, and (b) is a schematic view showing the condition of two fluids in a form of a mist comprising a mixture of IPA and $N_2$ gas ejected from the second bar-shaped portion.

After performing the DIW rinsing process for a predetermined time, DIW ejection from the third-ejection port 63 is stopped. While the water is kept rotating, IPA is supplied from the IPA supply mechanism 70*b* to the IPA supply passage 40*b*, and also $N_2$ gas is supplied from the first $N_2$ gas supply mechanism 70*c* to the first $N_2$ gas supply passage 40*c*. As shown in FIG. 12(*b*), the thus supplied IPA and $N_2$ gas are mixed at a position just before the second ejection ports 62 and then ejected towards the lower surface of the wafer W as IPA mist comprising a mixed fluid of the atomized IPA and $N_2$ gas. Thereby, all over the lower surface of the wafer W, the DIW remaining on the lower surface of the wafer W is replaced uniformly and rapidly with the IPA mist ejected from the plurality of second ejection ports 62 which are evenly arranged between a position opposing to the central portion of the rotating wafer and a position opposing to the peripheral portion of the rotating wafer, so that a uniform IPA liquid film is formed on the lower surface of the wafer W immediately. In this IPA substituting step, since $N_2$ gas is used for atomization of IPA, oxygen concentration and humidity in the space below the wafer W are lowered. Thus, efficiency of substitution of the IPA for the rinse liquid (DIW) is increased, and generation of water marks is suppressed. The use of $N_2$ gas for the IPA atomization is also advantageous in that an atmosphere of a low oxygen concentration and a low humidity has been already established at a point of time when the subsequent $N_2$ spin-drying step starts.

<$N_2$ Spin-Drying Step>

After performing the IPA substituting step for a predetermined time, the IPA ejection from the second ejection ports 62 is stopped. While the wafer is kept rotating (the rotation speed is preferably increased), $N_2$ gas is supplied from the second $N_2$ gas supply mechanism 70*e* to the second $N_2$ gas supply passage 40*e*, so that $N_2$ gas is ejected from the fourth ejection port 64 provided in the central portion 60C of the V-shaped nozzle 60 towards the central portion of the wafer W. Thus, a $N_2$ gas flow spreading from the central portion to the peripheral portion of the wafer W, and IPA remaining on the lower surface of the wafer W is removed by the $N_2$ gas flow. As previously described in connection with the DHF cleaning step, since the wafer W function as a shield that prevents the atmosphere below the wafer W from diffusing to a space above the wafer and the circumference of the wafer W is surrounded by the rotary cup 36 and the outer cup 56, the atmosphere below the wafer hardly diffuse out from the space surrounded by the lower surface of the wafer W and the inner surface of the outer cup 56. In addition, the atmosphere in the space surrounded by the lower surface of the wafer W and the inner surface of the outer cup 56 is sucked into the waste liquid drainage tube 58 connected to the factory exhaust system (of a slightly reduced pressure). Accordingly, if $N_2$ gas is supplied from the ejection port 64, the space below the wafer W is readily replaced with a $N_2$ gas atmosphere, i.e., an atmosphere of low oxygen concentration and low humidity. Generation of water marks are thus prevented efficiently. In the illustrated embodiment, a plate-like member, i.e., the lift pin plate 20, which covers the whole lower surface of the wafer W (having a size substantially the same as the wafer W), faces the wafer W. Therefore, a space having a small volume surrounded by the lower surface of the wafer W, the upper surface of the lift pin plate 20 and the inner surface of the rotary cup 36 is defined. An atmosphere in the space having such a small volume is readily replaced with $N_2$ gas atmosphere, and generation of water marks are thus prevented more efficiently.

<Wafer Unloading Step>

After $N_2$ spin-drying, wafer rotation is stopped. The vertical driving unit 50 moves the treatment fluid supply pipe 40 and the V-shaped nozzle 60 from the lower positions to the upper positions. At this time, each second interlocking member 46 pushes up one connecting member 24 so that the lift pin plate 20 moves upwards in association with the treatment fluid supply pipe 40 from the lower position to the upper position. The substrate retaining member 31 rotates about the axle 31*a* in the clockwise direction of FIG. 6 (the direction opposite to the arrow in FIG. 6) due to the bias force applied by the spring member 31*d*. The substrate retaining member 31 moves away laterally from the wafer W and the wafer W is then supported from its backside by the lift pins 22. After the lift pin plate 20, the treatment fluid supply pipe 40, and the V-shaped nozzle 60 have reached the respective upper positions as in FIG. 2B, the transport arm 104 carries away the wafer W from the lift pins 22. The wafer W is taken out or unloaded from the substrate cleaning apparatus 10 and is reversed upside down by the reverser 105.

Of the ejecting passages 67*a*, 67*b* and 68*b*, the $N_2$ gas ejecting passage 68*b* is a passage that delivers gas. When the supply of $N_2$ gas to the $N_2$ gas ejecting passage 68*b* is cut off, the external atmosphere of the nozzle tends to enter the $N_2$ gas ejecting passage 68*b*. This does not occur with the other ejecting passages that feed liquids because the liquid remain inside the passages even after the supply of liquid is cut off. If DHF atmosphere, for example, enters the $N_2$ gas ejecting passage 68*b*, it is unfavorable because the IPA mist comprising IPA and $N_2$ gas ejected afterwards would be contaminated. In order to prevent this, preferably, a slight amount of $N_2$ gas is constantly fed through the $N_2$ gas ejecting passage 68*b* so that the $N_2$ gas constantly flows out from each ejection port 62. Similarly, it is as well preferable to make a slight amount of $N_2$ gas constantly flow out from the ejection port 64 in order to maintain the cleanliness inside the ejection port 64.

In the foregoing embodiment, since the supplying of the IPA mist in the IPA substituting step is performed with the use of a nozzle having a plurality of ejection ports 62 which are evenly arranged between a position opposing to the central portion of the rotating wafer and a position opposing to the peripheral portion of the rotating wafer, the DIW remaining on the lower surface of the wafer W can be replaced with the IPA mist uniformly and rapidly. In addition, in each process step, notably in the $N_2$ spin-drying step, the space below the substrate is surrounded by the component parts (notably, the lift pin plate 22 and the rotary cup 36) of the liquid treatment apparatus, the space below the wafer W can be maintained at a desired atmosphere easily. That is, in the DHF cleaning step which is a chemical liquid treatment step, the chemical atmosphere is trapped or confined in the space below the wafer W; and in the $N_2$ spin-drying step, an atmosphere of a low oxygen concentration and a low humidity can be maintained in the space below the wafer W, or the space facing the process target surface of the wafer W.

Also in the foregoing embodiment, since the lower surface of the wafer W is supplied with the IPA mist (droplets), the use efficiency of IPA is improved. In the IPA substituting step, part of the IPA mist is vaporized to be in IPA vapor, which is lighter than the air. Accordingly, if the IPA existing on the lower surface of the wafer or in the space below the wafer W vaporized, the IPA vapor rises toward the lower surface of the wafer W so as to adhere to the wafer W, and can be utilized to replace the DIW. In addition, specifically in the foregoing embodiment, the lift pin plate 20 is provided to face the lower surface of the wafer W, and the circumference of the wafer W is surrounded by the rotary cup 36. Since the lift pin plate 20 prevents the IPA from escaping from the space below the wafer W, the IPA adhering to the lift pin plate 20 can also be utilized (if it is vaporized) to replace the DIW. The rotary cup 36 is expected to have the same similar function. In addition, an IPA atmosphere having a relatively high IPA concentration can easily be established in the space below the wafer W by using a small amount of IPA, because the space is surrounded by the wafer W, the lift pin plate 20 and the rotary cup 36.

The apparatus according to the embodiment employs the nozzle including the plurality of ejection ports 61 (62) arranged between a position opposing to the central portion of the wafer W and a position opposing to the peripheral portion of the wafer W, and configured to eject the same kind of treatment fluid from the plurality of ejection ports 61 (62). Thus, the lower surface of the wafer W can be treated with high in-plane uniformity.

In the foregoing embodiment, the lift pin plate 20, the treatment fluid supply pipe 40, and the V-shaped nozzle 60 move vertically relative to the retaining plate 30, and the lift pins 22 for supporting the wafer W from below are provided on the lift pin plate 20. Accordingly, in contrast to a conventional apparatus having lift pins which are to be retreated through through-holes formed in a bottom plate to a space below the bottom plate, there will be no or less cleaning liquid left on the lift pins 22 after drying a wafer W, preventing the cleaning liquid from adhering to the back surface of the wafer after the liquid treatment. This is because the lift pins 22 rotate integrally with the lift pin plate 20. In addition, by rotating the lift pins 22 together with the lift pin plate 20, droplets of cleaning liquid remained on the lift pins 22 can be reduced, which allows the back surface of the wafer W to have thereon even less droplets of the cleaning liquid after treatment. The central portion 60C of the V-shaped nozzle 60 is formed so as to close the through-hole 20a in the lift pin plate 20. This prevents the treatment liquid from entering the through-hole 20a provided to pass the treatment fluid supply pipe 40. Additionally, the treatment fluid supply pipe 40 and the V-shaped nozzle 60 move in vertical directions in association with the lift pin plate 20 so that when the treatment fluid supply pipe 40 and the lift pin plate 20 are moved up or down, the central portion 60C of the V-shaped nozzle 60 blocks the through-hole 20a in the lift pin plate 20. Entry of the treatment liquid into the through-hole 20a can be further prevented.

The rotary cup 36 disposed on the retaining plate 30 prevents cleaning liquid from scattering externally from the rotating wafer W during cleaning. Further, due to the substrate retaining member 31 attached on the retaining plate 30, the wafer W can be stably retained during rotation by supporting the wafer from its lateral side.

The foregoing embodiment may be modified as follows.

In the foregoing embodiment, removal of natural oxide films is carried out by performing sequentially the chemical liquid cleaning step using DHF, the DIW rinsing step, the IPA substituting step by ejecting two fluids comprising IPA and $N_2$ gas, and the $N_2$ spin drying step, in that order. However, the treatment conducted by a substrate treatment apparatus in the foregoing embodiment is not limited to this. For example, the chemical liquid cleaning step may use a chemical liquid other than the DHF. The chemical liquid cleaning step may be a resist removing step.

In view of the treatment uniformity and treatment liquid saving, it is preferable to use the nozzle shown in the accompanied drawings as a nozzle for supplying chemical liquid(s) onto the lower surface of the wafer W. However, the nozzle is not limited to that shown in the accompanied drawings. For example, the nozzle may be modified by maintaining the second bar-shaped portion 60B for supplying two-fluid spray comprising IPA and $N_2$ gas, while removing the first bar-shaped portion 60A for supplying DHF, and instead providing a chemical liquid ejection port for ejecting DHF in the central portion 60C of the nozzle. In this case, although the chemical liquid (DHF) consumption increases, the chemical liquid treatment still can be performed.

The foregoing embodiment employs an assembly comprising the lift pin plate 20 and the retaining plate 30 integrated with the rotary cup 36, as the substrate retaining unit of a so-called "spin chuck", in other words a mechanism for retaining and rotating the wafer. However, the V-shaped nozzle 60 of the foregoing embodiment may be combined with any of various types of spin chucks to construct a liquid treatment apparatus as long as the spin chuck is configured to hold the peripheral edge of the wafer.

The invention claimed is:
1. A liquid treatment apparatus comprising:
a substrate retaining unit comprising a retaining member configured to hold a peripheral edge of a substrate to retain the substrate horizontally;
a rotational driving unit configured to rotate the substrate retaining unit; and
a nozzle comprising a first ejection port provided to eject a chemical liquid toward a lower surface of the substrate retained by the substrate retaining unit, a plurality of second ejection ports provided to eject a mist containing isopropyl alcohol, IPA, and $N_2$ gas toward the lower surface of the substrate retained by the substrate retaining unit, a third ejection port provided to eject deionized water, DIW, toward the lower surface of the substrate retained by the substrate retaining unit, and a fourth ejection port provided to eject $N_2$ gas toward the lower surface of the substrate retained by the substrate retaining unit,
wherein the plurality of second ejection ports are arrayed between a position opposing to a central portion of the substrate and a position opposing to a peripheral portion of the substrate retained by the substrate retaining unit, wherein the nozzle has a central portion located below a central portion of the substrate retained by the substrate retaining unit, and a bar-shaped portion extending from the central portion of the nozzle in a radial direction of the substrate retained by the substrate retaining unit, wherein the plurality of second ejection ports are disposed in the bar-shaped portion so as to be arrayed in a longitudinal direction of the bar-shaped portion of the nozzle, wherein an IPA passageway and an $N_2$ gas passageway extend in the longitudinal direction of the bar-shaped portion of the nozzle, wherein IPA ejecting passages are connected to the IPA passageway, and $N_2$ gas ejecting passages are connected to the $N_2$ gas passageway, and wherein at locations near each of the second ejection ports respective IPA ejecting passages and respective $N_2$ gas ejecting passages merge together to cause a collision of the IPA and the $N_2$ gas to form an IPA mist that is ejected from the second ejecting ports.

2. The liquid treatment apparatus according to claim 1, wherein the substrate retaining unit comprises a plate-like member provided to face the lower surface of the substrate retained by the substrate retaining unit.

3. The liquid treatment apparatus according to claim 2, wherein the substrate retaining unit is provided with a rotary cup that rotates integrally with the substrate retaining unit.

4. The liquid treatment apparatus according to claim 1, wherein the third ejection port and the fourth ejection port are disposed in the central portion of the nozzle.

5. The liquid treatment apparatus according to claim 1, wherein the first ejection port is disposed in the central portion of the nozzle.

6. The liquid treatment apparatus according to claim 5, wherein the nozzle includes an additional bar-shaped portion, and a plurality of the first ejection ports are provided on the additional bar-shaped portion of the nozzle and arrayed in a longitudinal direction of the additional bar-shaped portion of the nozzle.

* * * * *